(12) United States Patent
Leng et al.

(10) Patent No.: US 12,058,886 B2
(45) Date of Patent: Aug. 6, 2024

(54) DISPLAY MODULE AND DISPLAY DEVICE (71) Applicant: Shanghai Tianma Micro-Electronics Co., Ltd., Shanghai (CN)

(72) Inventors: Chuanli Leng, Shanghai (CN); Ping An, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 426 days.

(21) Appl. No.: 17/643,516

(22) Filed: Dec. 9, 2021

(65) Prior Publication Data

US 2023/0097698 A1 Mar. 30, 2023

(30) Foreign Application Priority Data

Sep. 17, 2021 (CN) .......................... 202111094138.9

(51) Int. Cl.
*H10K 50/86* (2023.01)
*G02B 1/11* (2015.01)
*G02B 5/30* (2006.01)
*H10K 59/38* (2023.01)

(52) U.S. Cl.
CPC ............... *H10K 50/86* (2023.02); *G02B 1/11* (2013.01); *G02B 5/3025* (2013.01); *G02B 5/3083* (2013.01); *H10K 50/865* (2023.02); *H10K 59/38* (2023.02)

(58) Field of Classification Search
CPC ...... H10K 50/86; H10K 50/865; H10K 59/38; H10K 2102/351; H10K 50/858; H10K 59/10; G02B 1/11; G02B 5/3025; G02B 5/3083; G02B 1/111; G02B 1/18; G02B 27/281

See application file for complete search history.

(56) References Cited

U.S. PATENT DOCUMENTS

2021/0234124 A1* 7/2021 Li .......................... H10K 50/844

FOREIGN PATENT DOCUMENTS

CN 105022522 A * 11/2015 ....... G02F 1/133305

* cited by examiner

*Primary Examiner* — Douglas W Owens
(74) *Attorney, Agent, or Firm* — Anova Law Group, PLLC (57) ABSTRACT

A display module and a display device are provided. The display module includes a display panel, and an anti-reflection film disposed on a light-emitting side of the display panel. The anti-reflection film includes a buffer layer and a function layer disposed on a side of the buffer layer away from the display panel, and a refractive index of the buffer layer is greater than a refractive index of the function layer.

18 Claims, 5 Drawing Sheets

DISPLAY MODULE AND DISPLAY DEVICE

CROSS-REFERENCE TO RELATED APPLICATION

This application claims the priority of Chinese patent application No. 202111094138.9, filed on Sep. 17, 2021, the entirety of which is incorporated herein by reference.

FIELD

The present disclosure generally relates to the field of electronic equipment technology and, more particularly, relates to a display module and a display device.

BACKGROUND

With the continuous development of science and technology, more and more display devices, such as a mobile phone, a tablet computer, a notebook computer, and a smart wearable device, have been widely used and brought great convenience in people's daily life and work, and have become an indispensable and important tool.

A main component of the display device for achieving the display function includes a display panel. Compared with the liquid crystal display (LCD), the organic light-emitting semiconductor display panel (OLED) does not need a backlight, is featured with advantages such as high contrast, thin thickness, wide viewing angle, fast response speed, applicable in a flexible panel, wide operating temperature range, simple structure and manufacturing process, etc., and has been considered as emerging application technology for next generation flat panel display.

In the OLED display panel, to ensure the display quality, an anti-reflection structure needs to be disposed on a light-emitting side of the OLED display panel, to reduce the reflection of ambient light and to improve the display quality. The cost of forming an anti-reflection structure on the light-emitting side of a conventional OLED display panel is substantially high.

SUMMARY

One aspect of the present disclosure provides a display module. The display module includes a display panel, and an anti-reflection film disposed on a light-emitting side of the display panel. The anti-reflection film includes a buffer layer and a function layer disposed on a side of the buffer layer away from the display panel, and a refractive index of the buffer layer is greater than a refractive index of the function layer.

Another aspect of the present disclosure provides a display device. The display device includes a display module. The display module includes a display panel, and an anti-reflection film disposed on a light-emitting side of the display panel. The anti-reflection film includes a buffer layer and a function layer disposed on a side of the buffer layer away from the display panel, and a refractive index of the buffer layer is greater than a refractive index of the function layer.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

A protection layer located on a light-emitting side of the display panel reflects most of the ambient light, and the reflection of the protection layer accounts for more than 70% of the total reflection. Although the disposure of an anti-reflection coating layer on the surface of the protection layer effectively reduces the surface reflectivity, the anti-reflection coating layer with desired reflection effect often includes four layers or even more than six layers, the cost is high, and the anti-reflection coating layer including a large amount of layers will cause color cast of the reflected light in the dark state.

To solve the above-mentioned problems, the present disclosure provides a display module. An anti-reflection film may be disposed on a light-emitting side of the display panel. The anti-reflection film may include a buffer layer and a function layer that have different refractive indexes. The function layer may be disposed on a side of the buffer layer away from the display panel, and a refractive index of the buffer layer may be greater than a refractive index of the function layer. In view of this, a portion of the ambient light reflected by the buffer layer and another portion of the ambient light reflected by the function layer may destructively interfere on a surface of the function layer away from the display panel, thereby reducing the reflection of the ambient light and improving the display quality. Therefore, in the present disclosure, the anti-reflection film may be composed of two film layers having different refractive indexes. The quantity of film layers may be substantially small, and the problem of color cast of the reflected light in the dark state may be avoided, such that the display module may have a small thickness, and may have a low manufacturing cost.

Figure 1:
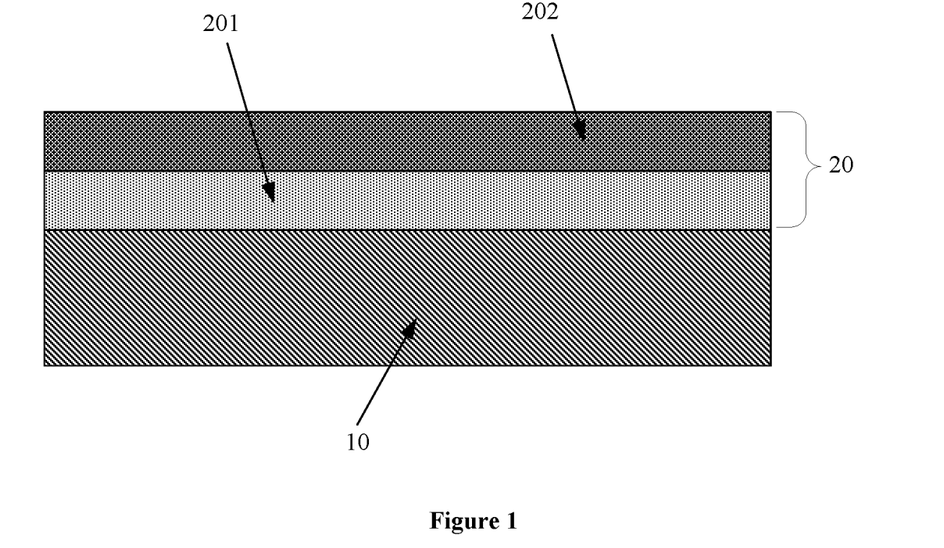
FIG. 1 illustrates a schematic diagram of an exemplary display module consistent with disclosed embodiments of the present disclosure.

FIG. 1 illustrates a schematic diagram of a display module consistent with disclosed embodiments of the present disclosure. Referring to FIG. 1, the display module may include a display panel 10, and an anti-reflection film 20 disposed on a light-emitting side of the display panel 10. The anti-reflection film 20 may include a buffer layer 201 and a function layer 202 disposed on a side of the buffer layer 201 away from the display panel 10. A refractive index of the buffer layer 201 may be greater than a refractive index of the function layer 202.

A portion of the ambient light incident on the display module may be reflected by the buffer layer 201, and another portion of the ambient light incident on the display module may be reflected by a surface of the function layer 202 away from the display panel 10. Because the refractive index of the buffer layer 201 is greater than the refractive index of the function layer 202, the two portions of the reflected ambient light may destructively interfere on the surface of the function layer 202 away from the display panel 10, thereby reducing the reflection of the ambient light and improving the display quality.

In the present disclosure, the display module may include the anti-reflection film composed of two film layers having different refractive indexes. The quantity of film layers may be substantially small, and the problem of color cast of the reflected light in the dark state may be avoided, such that the display module may have a small thickness, and may have a low manufacturing cost.

The function layer 202 may have a thickness D1, and the refractive index $n_1$. The thickness D1 and the refractive index $n_1$ of the function layer 202 may satisfy a following formula:

$$D_1 \geq \frac{\lambda}{4n_1\mu}, \quad (1)$$

where $\mu$ is a preset constant coefficient, and $\lambda$ is a wave constant smaller than a minimum wavelength of visible light. When the thickness D1 and the refractive index $n_1$ of the function layer 202 satisfy the formula (1), the ambient light reflected by the function layer 202 may effectively destructively interfere with the ambient light reflected by the buffer layer 201, to achieve a desired anti-reflection effect.

In one embodiment, when $\lambda$<380 nm, 0.8<$\mu$<1.2, and 1.2<$n_1$<1.45. When the wave constant $\lambda$, the thickness D1 and the refractive index $n_1$ are within the above-mentioned value range, the anti-reflection effect may be desired.

The buffer layer 201 may have the refractive index $n_2$, and $n_2$>1.45. When the refractive index is less than 1.45, it is convenient to choose the materials of the buffer layer 201 and the function 202, and it is convenient to satisfy the formula (1), so as to achieve a better anti-reflection effect.

A thickness of the buffer layer 201 may be in a range of approximately 2 μm-10 μm. When the thickness of the buffer layer 201 is in a range of approximately 2 μm-10 μm, the buffer layer 201 may have an appropriate thickness. On the one hand, if the thickness of the buffer layer is substantially large, the thickness of the display module may increase. On the other hand, if the thickness of the buffer layer is substantially small, the buffer layer may not provide effective support and may not increase the adhesion stability of the function layer 202.

Figure 2:
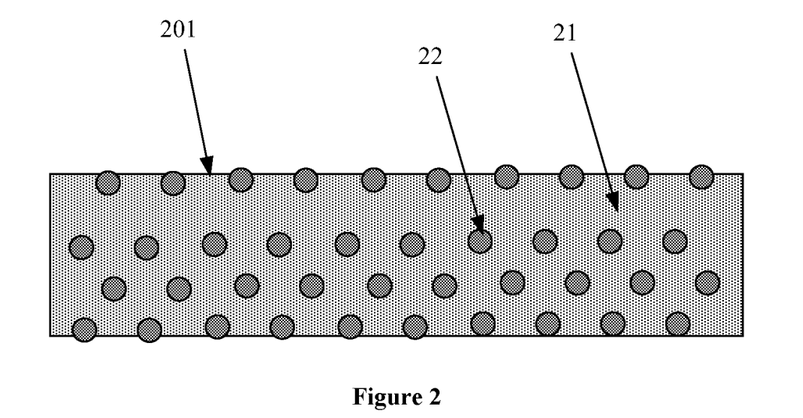
FIG. 2 illustrates a schematic diagram of an exemplary buffer layer consistent with disclosed embodiments of the present disclosure.

FIG. 2 illustrates a schematic diagram of the buffer layer consistent with disclosed embodiments of the present disclosure. Referring to FIG. 2, the buffer layer 201 may include a light-transmitting organic layer 21, and the light-transmitting organic layer 21 may be mixed with light-transmitting inorganic particles 22. After the inorganic particles 22 are uniformly mixed in an organic material, the buffer layer 201 may be formed by a coating process or a printing process. The disposure of inorganic particles 22 in the organic layer 21 may increase the abrasion resistance and strength of the buffer layer 201, and the inorganic particles 22 on the surface of the buffer layer may increase the adhesion stability of the function layer 202.

A diameter of an inorganic particle 22 may be less than or equal to 50 nm. When the diameter of the inorganic particle 22 is less than or equal to 50 nm, the size may be much smaller than the wavelength of visible light, which may avoid affecting the light emitted by the display panel to ensure the display effect.

In one embodiment, the function layer 202 may be made of a hydrophobic and oleophobic material, to prevent the intrusion of water vapor, to improve the service life of the display module, and to achieve the anti-fingerprint function.

Optionally, the function layer 202 may be made of one or more of fluorosilane, alkoxysilane, and hydrofluoroether. After being cured at a high temperature, these materials may form a firm and stable contact with the buffer layer 201 made of the organic material, and may have desired abrasion resistance and mechanical strength. The function layer 202 may be formed on the surface of the buffer layer 201 by a coating process or a printing process. The function layer 202 cured at a high temperature may have desired high-performance.

In one embodiment, referring to FIG. 1, the buffer layer 201 and the function layer 202 may be directly formed over the surface of the display panel 10 in sequence, to facilitate the formation of the anti-reflection film on the light-emitting side of the display panel 10.

Figure 3:
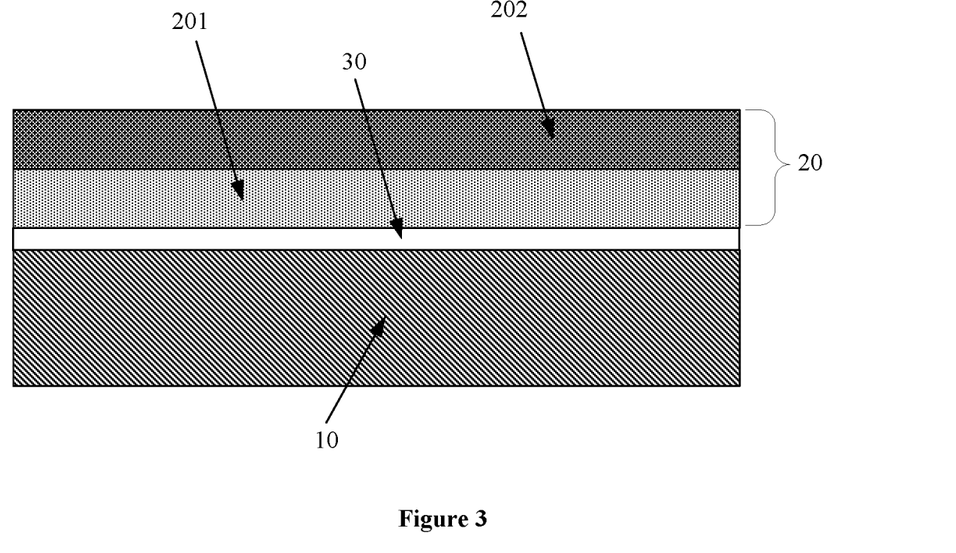
FIG. 3 illustrates a schematic diagram of another exemplary display module consistent with disclosed embodiments of the present disclosure.

FIG. 3 illustrates a schematic diagram of another display module consistent with disclosed embodiments of the present disclosure. Referring to FIG. 3, the anti-reflection film 20 may be bonded and fixed to the light-emitting side of the display panel 10 through an optical glue 30. In view of this, after the display panel 10 and the anti-reflection film 20 are separately manufactured, the anti-reflection film 20 may be bonded and fixed to the light-emitting side of the display panel 20 through the optical glue 30. The buffer layer 201 and the function layer 202 may be formed over a carrier board in sequence to form the anti-reflection film 20. Then, the anti-reflection film 20 and the carrier board may be separated, and an independent anti-reflection film 20 may be formed.

Figure 4:
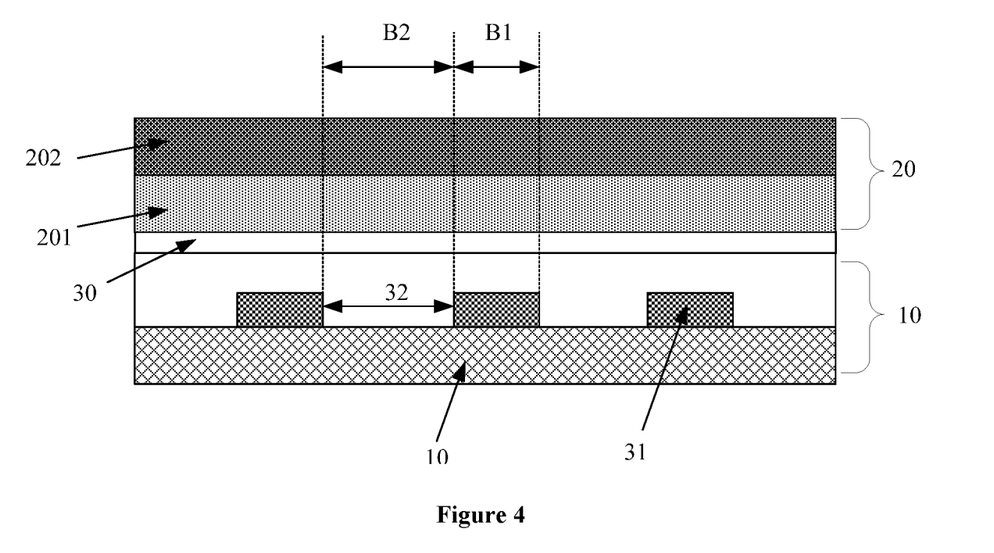
FIG. 4 illustrates a schematic diagram of another exemplary display module consistent with disclosed embodiments of the present disclosure.

FIG. 4 illustrates a schematic diagram of another display module consistent with disclosed embodiments of the present disclosure. Referring to FIG. 4, the display panel 10 may include a plurality of sub-pixels 31 arranged in an array, and each sub-pixel 31 may include an organic light-emitting diode (OLED). Adjacent sub-pixels 31 may be spaced apart by a pixel gap 32. The anti-reflection film 20 may include a plurality of first regions B1, and the first regions B1 and the sub-pixels 31 may be arranged in a one-to-one correspondence. The anti-reflection film 20 may also include a second region B2 surrounding the first region B1. In a direction perpendicular to the display panel 10, the second region B2 may not overlap with the sub-pixel 31. The first region B1 may be light-transmitting, and the light transmittance of the second region B2 may be less than the light transmittance of the first region B1.

In the embodiment associated with FIG. 4, the reflection of the ambient light on the surface of the anti-reflection film 20 may be further reduced by the second region B2 with substantially small light transmittance.

Figure 5:
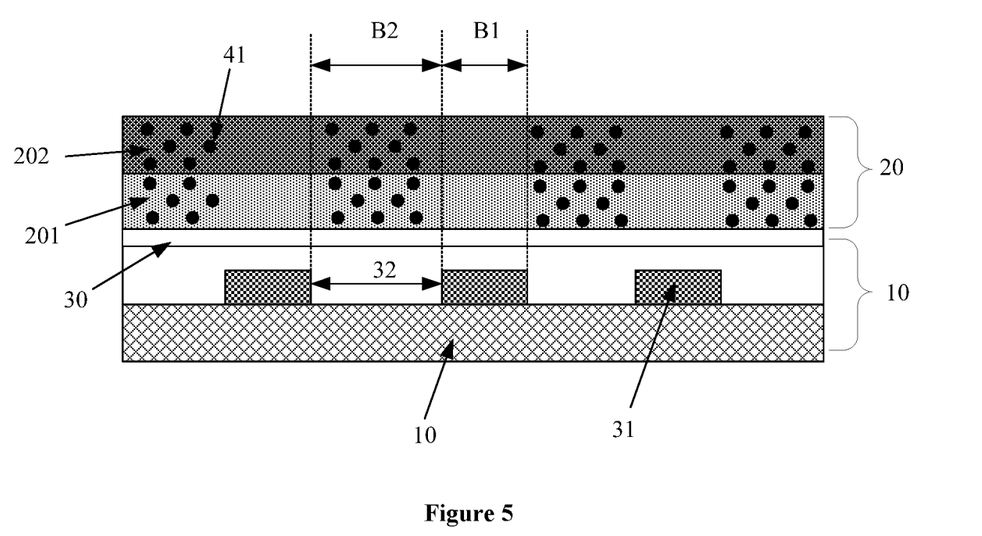
FIG. 5 illustrates a schematic diagram of another exemplary display module consistent with disclosed embodiments of the present disclosure.

FIG. 5 illustrates a schematic diagram of another display module consistent with disclosed embodiments of the present disclosure. Referring to FIG. 5, in the second region B2, the buffer layer 201 may be mixed with light-absorbing particles 41, and the function layer 202 may be mixed with the light-absorbing particles 41, such that the light transmittance of the second region B2 may be less than the light transmittance of the first region B1. The ambient light incident on the display module may be absorbed by the light-absorbing particles 41 in the second region B2, thereby reducing the reflectivity of the display module to the ambient light.

In another embodiment, in the second region B2, one of the buffer layer 201 and the function layer 202 may be mixed with the light-absorbing particles 41. In view of this, the light transmittance of the second region B2 may be less than the light transmittance of the first region B1.

The light-absorbing particles may include carbon powder or any other black particles, and may be configured to absorb light and reduce the reflection of ambient light.

Figure 6:
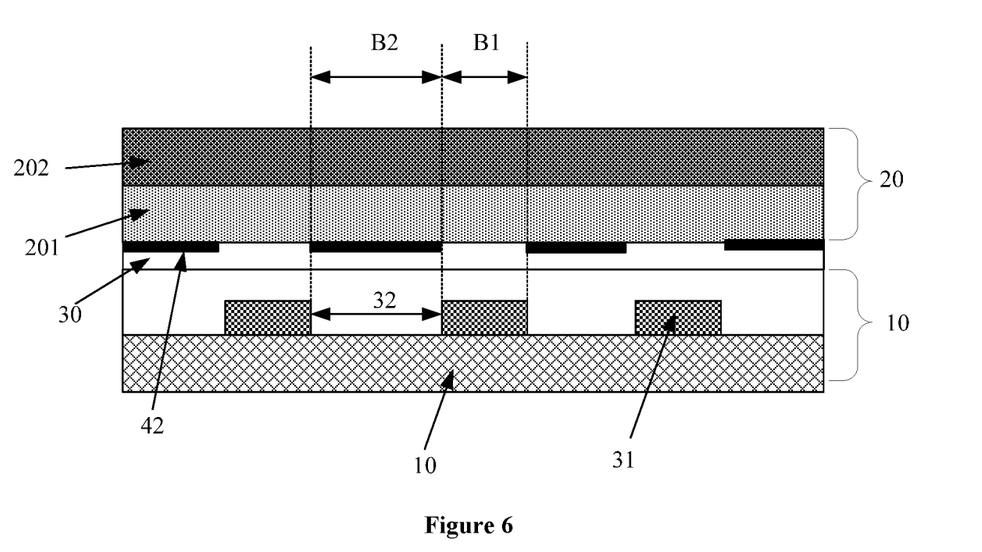
FIG. 6 illustrates a schematic diagram of another exemplary display module consistent with disclosed embodiments of the present disclosure.

FIG. 6 illustrates a schematic diagram of another display module consistent with disclosed embodiments of the present disclosure. Referring to FIG. 6, a light-absorbing film layer 42 may be disposed on the side of the buffer layer 201 facing towards the display panel 10. In the direction perpendicular to the display panel 10, the light-absorbing film layer 42 may not overlap with the first region B1. The ambient light incident on the display module may be absorbed by the light-absorbing film layer 42 in the second region B2, thereby reducing the reflectivity of the display module to the ambient light.

In the embodiment associated with FIG. 6, the light-absorbing film layer 42 may be a black ink layer. The black ink layer may have desired light-absorbing effect, and may be formed by a printing process or a coating process. The manufacturing process may be simple and the manufacturing cost may be low.

Figure 7:
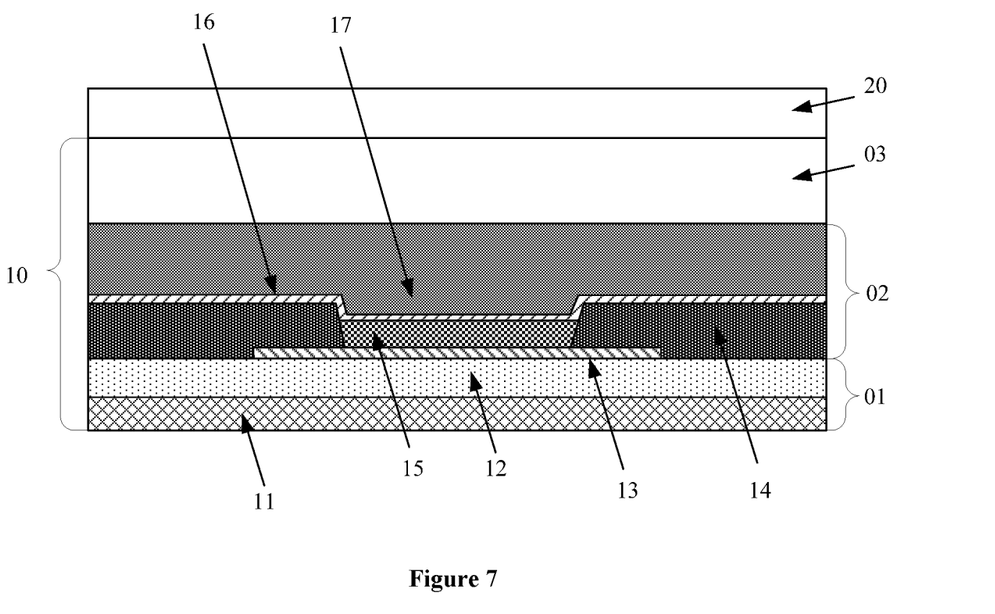
FIG. 7 illustrates a schematic diagram of another exemplary display module consistent with disclosed embodiments of the present disclosure.

FIG. 7 illustrates a schematic diagram of another display module consistent with disclosed embodiments of the present disclosure. Referring to FIG. 7, in the display module, the display panel 10 may be an OLED display panel. The OLED display panel may include an array substrate 01, a pixel circuit on the array substrate, and a display array 02 disposed on the array substrate 01. The display array 02 may include a sub-pixel, the sub-pixel may be connected with the pixel circuit, and the pixel circuit may drive the sub-pixel to emit light for display.

The OLED display panel may also include a filter structure 03 disposed on the side of the display array 02 away from the array substrate 01. The filter structure 03 may be configured to filter out the ambient light and transmit the light emitted by the sub-pixel of the OLED display panel.

The anti-reflection film 20 may be disposed on the side of the filter structure 03 away from the display array 02, and may be configured to further reduce the reflection of the display module to the ambient light.

The array substrate 01 may include a substrate 11 and an array layer 12 disposed on the substrate 11. The array layer 12 may include the pixel circuit. The material of the substrate 11 may be selected based on requirements. In one embodiment, the substrate may be an unbendable rigid substrate, such as a glass plate, and in view of this, an unbendable display module may be formed. In another embodiment, the substrate may be a flexible substrate, such as a polyimide (PI) substrate, and in view of this, a bendable display module may be formed.

The sub-pixel may include a first electrode layer disposed on the array substrate 01. The first electrode layer may include a plurality of first electrodes 13 corresponding to light-emitting units in a one-to-one correspondence, and the first electrode may be connected to the pixel circuit. The sub-pixel may also include a pixel definition layer 14. The pixel definition layer 14 may include a plurality of pixel openings corresponding to the sub-pixels in a one-to-one correspondence. The pixel opening may be configured to expose the first electrode 13 of the sub-pixel. Moreover, the sub-pixel may include a light-emitting layer 15 disposed on the surface of the first electrode 13 in the pixel opening, and a second electrode 16 covering the light-emitting layer 15 and the pixel definition layer 14. Further, the sub-pixel may include an encapsulation layer 17 disposed on a side of the second electrode 16 away from the light-emitting layer 15. The encapsulation layer 17 may be configured to seal, protect and planarize the display array 02. The filter structure 03 may be disposed on the side of the encapsulation layer away from the second electrode 16.

Figure 8:
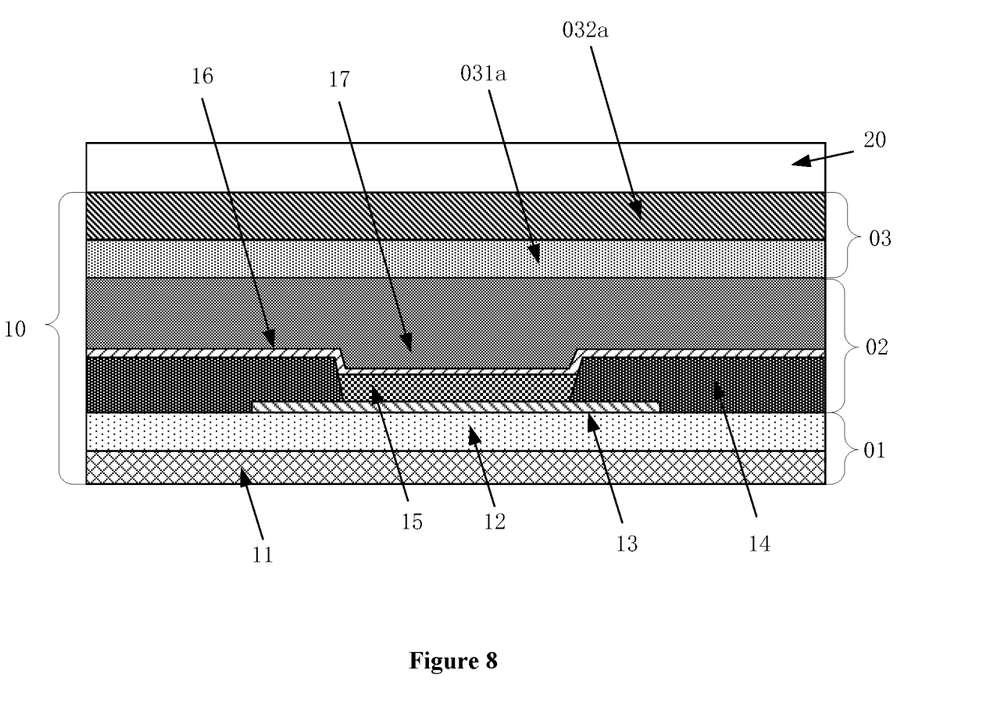
FIG. 8 illustrates a schematic diagram of another exemplary display module consistent with disclosed embodiments of the present disclosure.

FIG. 8 illustrates a schematic diagram of another display module consistent with disclosed embodiments of the present disclosure. Referring to FIG. 8, the filter structure 03 may have a polarization filter structure. The filter structure 03 may be configured to filter out ambient light through polarization adjustment, and to transmit the light emitted by the sub-pixel.

In one embodiment, in the display module shown in FIG. 8, the display panel may include the display array 02 disposed on the surface of the array substrate 01. The display array 02 may include a plurality of sub-pixels arranged in an array, and the encapsulation layer 17 disposed on the side of the sub-pixel away from the array substrate 01. Moreover, the display panel may include a quarter-wave plate 031a disposed on a side of the encapsulation layer 17 facing towards the anti-reflection film 20, and a polarizer 032a disposed on a side of the quarter-wave plate 031a facing towards the anti-reflection film 20.

Referring to FIG. 8, the filter structure 03 may have the polarization filter structure, and may include the quarter-wave plate 031a and the polarizer 032a.

When the filter structure 03 has the polarization filter structure and includes the quarter-wave plate 031a and the polarizer 032a, a portion of the ambient light incident on the display module may be canceled through interference by the anti-reflection film, and another portion of the ambient light may be first converted to first linearly polarized light through the polarizer 032a after being incident on the filter structure 03. The first linearly polarized light may be converted to circularly polarized light after passing through the quarter-wave plate 031*a*, and the circularly polarized light may be reflected by the display panel and may be converted to second linearly polarized light after passing through the quarter-wave plate 031*a*. A polarization direction of the second linearly polarized light may be perpendicular to a polarization direction of the first linearly polarized light, such that the polarizer 032*a* may block the emission of the second linearly polarized light, to reduce the reflectivity of the display module to the ambient light.

Figure 9:
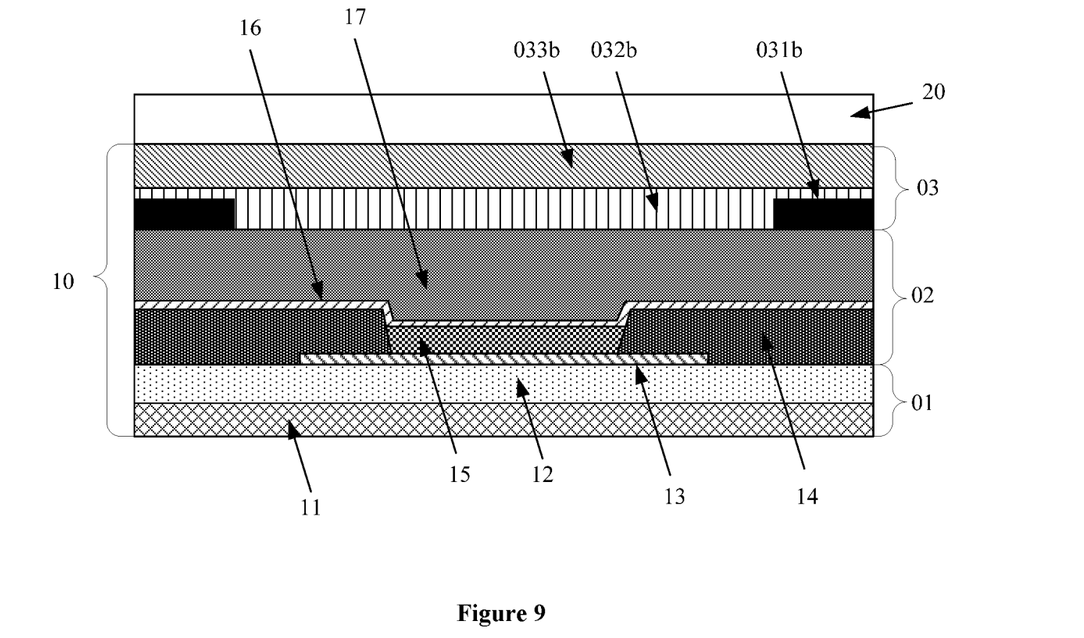
FIG. 9 illustrates a schematic diagram of another exemplary display module consistent with disclosed embodiments of the present disclosure.

FIG. 9 illustrates a schematic diagram of another display module consistent with disclosed embodiments of the present disclosure. Referring to FIG. 9, the filter structure 03 may have a color resist filter structure. The filter structure 03 may be configured to filter out ambient light through selective transmittance of light of color resist, and to transmit the light emitted by the sub-pixel.

In one embodiment, in the display module shown in FIG. 9, the display panel may include the display array 02 disposed on the surface of the array substrate 01. The display array 02 may include a plurality of sub-pixels arranged in an array, and the encapsulation layer 17 disposed on the side of the sub-pixel away from the array substrate 01. The display panel may also include a black matrix 031*b* disposed on the side of the encapsulation layer 17 facing towards the anti-reflection film 20, and the black matrix 031*b* may include a plurality of openings corresponding to the sub-pixels in a one-to-one correspondence. Further, the display panel may include a color resist 032*b* disposed in the opening, and the color resist 032*b* may have a same color as the light emitted by the corresponding sub-pixel, and may be configured to block the emission of the light of any other color.

In the embodiment associated with FIG. 9, the filter structure 03 may have the color resist filter structure, and may include the black matrix 031*b* and the color resist 032*b*. In one embodiment, the filter structure 03 may include a protection layer 033*b* disposed between the color resist 032*b* and the anti-reflection film 20.

When the filter structure 03 has the color resist filter structure, and includes the black matrix 031*b* and the color resist 032*b*, a portion of the ambient light incident on the display module may be canceled through interference by the anti-reflection film, and another portion of the ambient light may be absorbed by the black matrix 031*b* and the color resist 032*b* thereon in the pixel gap region after being incident on the filter structure 03. In the corresponding sub-pixel region, the light of the same color as the light emitted by the sub-pixel may pass through the color resist, and the light of any other color may be absorbed by the color resist, thereby reducing the reflection of ambient light.

In an existing OLED panel, although a portion of the ambient light may be absorbed through a corresponding filter structure, thereby reducing the reflection of the ambient light, the outer surface may still have a substantially high reflectivity. In the present disclosure, through disposing the anti-reflection film on the light-emitting side of the display panel, the reflectivity of the display module to the ambient light may be further reduced, thereby improving the display quality.

Figure 10:
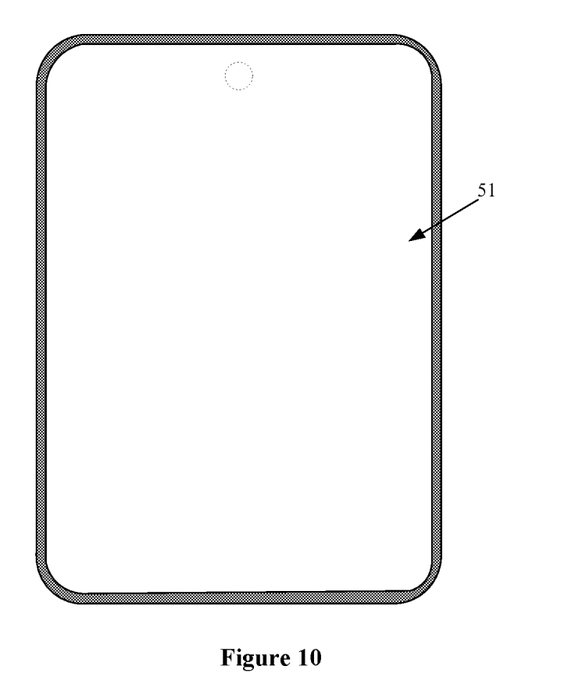
FIG. 10 illustrates a schematic diagram of an exemplary display device consistent with disclosed embodiments of the present disclosure.

Accordingly, the present disclosure also provides a display device. FIG. 10 illustrates a schematic diagram of a display device consistent with disclosed embodiments of the present disclosure. Referring to FIG. 10, the display device may include a display module 51, and the display module 51 may include a display module in any of the foregoing disclosed embodiments.

In the present disclosure, the display device may include but may not be limited to electronic devices with display functions such as a mobile phone, a tablet computer, a notebook computer, and a smart wearable device, etc. Because the display device includes the display module in the foregoing disclosed embodiments, a portion of the ambient light incident on the display module may be reflected by the buffer layer, and another portion of the ambient light may be reflected by the surface of the function layer away from the display panel. Because the refractive index of the buffer layer is greater than the refractive index of the function layer, the two portions of the reflected ambient light may destructively interfere on the surface of the function layer away from the display panel, thereby reducing the reflection of the ambient light and improving the display quality.

The various embodiments in the present disclosure may be described in a progressive, or parallel, or a combination of progressive and parallel manner. Each embodiment may focus on the difference from other embodiments, and the same and similar parts between the various embodiments may refer to each other. For the disclosed display device in the present disclosure, because the display device corresponds to the disclosed display module, the description of the display device may be substantially simple, and the related part may refer to the description of the corresponding part of the display module.

It should be noted that in the description of the present disclosure, orientation or positional relationship indicated by the terms "upper", "lower", "top", "bottom", "inner", and "outer" may be based on the orientation or positional relationship shown in the drawings, and may merely be used for the convenience of describing the present disclosure and simplifying the description, and may not indicate or imply that the referred devices or components have to have a specific orientation and have to be constructed and operated in a specific orientation, and, thus, may not be understood as restrictions on the present disclosure. When a component is considered to be "connected" to another component, the component may be directly connected to the another component, or may be connected through a centrally located component.

It should be noted that the relational terms such as "first" and "second" are merely used to distinguish one entity or operation from another entity or operation, and do not necessarily require or imply any such actual relationship or sequence between these entities or operations. Moreover, the terms "include", "contain" or any variant may be intended to cover non-exclusive inclusion, such that a process, a method, an article, or a device that includes a series of elements may not only include such elements, but also include any other element that is not clearly listed, or may include elements inherent to such process, method, article or device. In a case without more restrictions, the element defined by the sentence "including . . . " may not exclude the existence of any other same element in the process, method, article, or device that includes the element.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display module, comprising:
a display panel; and
an anti-reflection film disposed on a light-emitting side of the display panel, wherein:
the anti-reflection film includes a buffer layer and a function layer disposed on a side of the buffer layer away from the display panel, and
a refractive index of the buffer layer is greater than a refractive index of the function layer.

2. The display module according to claim 1, wherein:
the function layer has a thickness D1 and has the refractive index $n_1$, wherein $$D_1 \geq \frac{\lambda}{4n_1\mu},$$

$\mu$ is a preset constant coefficient, and $\lambda$ is a wave constant smaller than a minimum wavelength of visible light.

3. The display module according to claim 2, wherein: $\lambda<380$ nm, $0.8<\mu<1.2$, and $1.2<n_1<1.45$.

4. The display module according to claim 1, wherein: the buffer layer has the refractive index $n_2$, wherein $n_2>1.45$.

5. The display module according to claim 1, wherein: a thickness of the buffer layer is in a range of approximately 2 μm-10 μm.

6. The display module according to claim 1, wherein: the buffer layer includes a light-transmitting organic layer, wherein the light-transmitting organic layer is mixed with light-transmitting inorganic particles.

7. The display module according to claim 6, wherein: a diameter of an inorganic particle of the light-transmitting inorganic particles is less than or equal to 50 nm.

8. The display module according to claim 1, wherein: the function layer is made of a hydrophobic and oleophobic material.

9. The display module according to claim 1, wherein: the function layer is made of one or more of fluorosilane, alkoxysilane, and hydrofluoroether.

10. The display module according to claim 1, wherein: the anti-reflection film is bonded and fixed to the light-emitting side of the display panel through an optical glue.

11. The display module according to claim 1, wherein: the display panel includes a plurality of sub-pixels arranged in an array, wherein adjacent sub-pixels of the plurality of sub-pixels are spaced apart by a pixel gap; the anti-reflection film includes a plurality of first regions, wherein the plurality of first regions and the plurality of sub-pixels are arranged in a one-to-one correspondence; and
the anti-reflection film further includes a second region surrounding a first region of the plurality of first regions, wherein:
in a direction perpendicular to the display panel, the second region does not overlap with a sub-pixel of the plurality of sub-pixels,
the first region is light-transmitting, and
a light transmittance of the second region is less than a light transmittance of the first region.

12. The display module according to claim 11, wherein:
in the second region, the buffer layer is mixed with light-absorbing particles, and/or
in the second region, the function layer is mixed with the light-absorbing particles.

13. The display module according to claim 12, wherein:
the light-absorbing particles include carbon powder particles.

14. The display module according to claim 11, further including:
a light-absorbing film layer disposed on a side of the buffer layer facing towards the display panel, wherein in the direction perpendicular to the display panel, the light-absorbing film layer does not overlap with the first region.

15. The display module according to claim 14, wherein:
the light-absorbing film layer is a black ink layer.

16. The display module according to claim 1, wherein the display panel includes:
a display array disposed on a surface of an array substrate, wherein the display array includes a plurality of sub-pixels arranged in an array, and an encapsulation layer disposed on a side of a sub-pixel of the plurality of sub-pixels away from the array substrate;
a quarter-wave plate disposed on a side of the encapsulation layer facing towards the anti-reflection film; and
a polarizer disposed on a side of the quarter-wave plate facing towards the anti-reflection film.

17. The display module according to claim 1, wherein the display panel includes:
a display array disposed on a surface of an array substrate, wherein the display array includes a plurality of sub-pixels arranged in an array, and an encapsulation layer disposed on a side of a sub-pixel of the plurality of sub-pixels away from the array substrate;
a black matrix disposed on a side of the encapsulation layer facing towards the anti-reflection film, wherein the black matrix includes a plurality of openings corresponding to the plurality of sub-pixels in a one-to-one correspondence; and
a color resist disposed in an opening of the plurality of openings, wherein the color resist has a same color as light emitted by a corresponding sub-pixel, and blocks emission of light of any other color.

18. A display device, comprising:
a display module, the display module including:
a display panel; and
an anti-reflection film disposed on a light-emitting side of the display panel, wherein:
the anti-reflection film includes a buffer layer and a function layer disposed on a side of the buffer layer away from the display panel, and
a refractive index of the buffer layer is greater than a refractive index of the function layer.

* * * * *